US012619812B2

(12) United States Patent
Lin et al.

(10) Patent No.: US 12,619,812 B2
(45) Date of Patent: May 5, 2026

(54) AUTOMATICALLY GENERATING METHOD, AUTOMATICALLY GENERATING SYSTEM FOR GENERATING SIMULATION CIRCUIT AND COMPUTER READABLE RECORDING MEDIUM

(71) Applicant: Universal Global Technology (Kunshan) Co., Ltd., Jiangsu Province (CN)

(72) Inventors: Wei Yuan Lin, Jiangsu Province (CN); Chun Huang Lee, Jiangsu Province (CN)

(73) Assignee: Universal Global Technology (Kunshan) Co., Ltd., Jiangsu Province (CN)

( * ) Notice: Subject to any disclaimer, the term of this patent is extended or adjusted under 35 U.S.C. 154(b) by 636 days.

(21) Appl. No.: 18/309,836

(22) Filed: May 1, 2023

(65) Prior Publication Data

US 2024/0211672 A1     Jun. 27, 2024

(30) Foreign Application Priority Data

Dec. 23, 2022    (CN) .......................... 202211664219.2

(51) Int. Cl.
*G06F 30/392*          (2020.01)
(52) U.S. Cl.
CPC ................................. *G06F 30/392* (2020.01)
(58) Field of Classification Search
CPC .................................................... G06F 30/392
USPC ........................................................ 716/100
See application file for complete search history.

(56) References Cited

U.S. PATENT DOCUMENTS 8,682,631 B2 *   3/2014   Chang ................... G06F 30/367
                                                                 703/20
10,803,222 B1 *  10/2020  Liu ........................ G06F 30/394
2003/0232603 A1 *  12/2003  Tanaka .................. H01P 1/2005
                                                                455/90.3

(Continued)

FOREIGN PATENT DOCUMENTS

CN          103324771 A       9/2013
CN          108551332 A       9/2018
            (Continued)

*Primary Examiner* — Suchin Parihar
(74) *Attorney, Agent, or Firm* — CKC & Partners Co., LLC

(57)           ABSTRACT

An automatically generating method for generating a simulation circuit includes performing a circuit dividing step, a circuit segmenting step, a main element model generating step, a circuit segment model generating step and a model combining step. The circuit dividing step includes accessing a radio frequency circuit information from a memory unit, and dividing the radio frequency circuit information into a plurality of circuit units. The circuit segmenting step includes transforming each of the circuit units into a plurality of circuit segments. The main element model generating step includes generating at least one main element model. The circuit segment model generating step includes generating a circuit segment model. The circuit segment model is corresponding to each of the circuit segments. The model combining step includes combining the at least one main element model and the circuit segment model corresponding to each of the circuit segments to generate the simulation circuit.

11 Claims, 7 Drawing Sheets

(56) References Cited

U.S. PATENT DOCUMENTS

| 2004/0243373 A1* | 12/2004 | Sercu | .................... G06F 30/367 |
| | | | 703/14 |
| 2011/0153305 A1* | 6/2011 | Chang | .................... G06F 30/33 |
| | | | 703/13 |
| 2020/0410153 A1* | 12/2020 | MacRae | ................ G06F 30/327 |
| 2021/0279395 A1* | 9/2021 | Rawat | ................. G06F 30/367 |
| 2022/0165543 A1* | 5/2022 | Howald | ........... H01J 37/32174 |
| 2025/0335684 A1* | 10/2025 | Tian | ..................... G06F 30/367 |

FOREIGN PATENT DOCUMENTS

| CN | 114556457 A | 5/2022 |
| TW | 202016777 A | 5/2020 |

* cited by examiner

S200

AUTOMATICALLY GENERATING METHOD, AUTOMATICALLY GENERATING SYSTEM FOR GENERATING SIMULATION CIRCUIT AND COMPUTER READABLE RECORDING MEDIUM

RELATED APPLICATIONS

This application claims priority to China Application Serial Number 202211664219.2, filed Dec. 23, 2022, which is herein incorporated by reference.

BACKGROUND

Technical Field

The present disclosure relates to an automatically generating method, an automatically generating system for generating a simulation circuit and a computer readable recording medium. More particularly, the present disclosure relates to an automatically generating method, an automatically generating system for generating a radio frequency simulation circuit and a computer readable recording medium.

Description of Related Art

A radio frequency (RF) engineer can simulate a radio frequency circuit by a simulation tool during the circuit developing process to verify the efficiency of the circuit and correct the circuit. Because the circuit layout and the circuit simulation are executed by different software, the electrical property simulation engineer needs to input the circuit into the simulation tool manually, and set the relative parameter of the circuit after the RF engineer completed the circuit layout. However, due to the requirement of the wireless transmission function in a mobile device is increased, there are many wireless channels in a radio frequency circuit, and the complexity of inputting the radio frequency circuit in the simulation tool is also increased. The electrical property simulation engineer needs to spend a lot of time to input the circuit into the simulation tool, and input errors may occur.

Thus, developing an automatically generating method, an automatically generating system for generating a simulation circuit and a computer readable recording medium which can reduce a circuit transforming time is commercially desirable.

SUMMARY

According to one aspect of the present disclosure, an automatically generating method for generating a simulation circuit is configured to generate the simulation circuit automatically according to a radio frequency circuit information. The automatically generating method for generating the simulation circuit includes performing a circuit dividing step, a circuit segmenting step, a main element model generating step, a circuit segment model generating step and a model combining step. The circuit dividing step includes configuring a processor to access the radio frequency circuit information from a memory unit, and divide the radio frequency circuit information into a plurality of circuit units. The circuit segmenting step includes configuring the processor to transform each of the circuit units into a plurality of circuit segments according to a circuit connecting relationship of each of the circuit units. Each of the circuit segments includes at least one main element data and at least one peripheral element data. The main element model generating step includes configuring the processor to generate at least one main element model according to the at least one main element data of each of the circuit segments and at least one first parameter corresponding to the at least one main element data. The at least one main element model is corresponding to the at least one main element data of each of the circuit segments. The circuit segment model generating step includes configuring the processor to generate a circuit segment model according to the at least one peripheral element data of each of the circuit segments and at least one second parameter corresponding to the at least one peripheral element data. The circuit segment model is corresponding to each of the circuit segments. The model combining step includes configuring the processor to combine the at least one main element model and the circuit segment model corresponding to each of the circuit segments to generate the simulation circuit.

According to another aspect of the present disclosure, an automatically generating system for generating a simulation circuit is configured to generate the simulation circuit automatically according to a radio frequency circuit information. The automatically generating system for generating the simulation circuit includes a memory unit and a processor. The memory unit stores the radio frequency circuit information, a plurality of circuit units, a plurality of circuit segments corresponding to each of the circuit units, at least one first parameter and at least one second parameter corresponding to each of the circuit segments. Each of the circuit segments includes at least one main element data and at least one peripheral element data. The processor is signally connected to the memory unit, and configured to perform an automatically generating method for generating the simulation circuit. The automatically generating method for generating the simulation circuit includes performing a circuit dividing step, a circuit segmenting step, a main element model generating step, a circuit segment model generating step and a model combining step. The circuit dividing step includes accessing the radio frequency circuit information from the memory unit, and dividing the radio frequency circuit information into the circuit units. The circuit segmenting step includes transforming each of the circuit units into the circuit segments according to a circuit connecting relationship of each of the circuit units. The main element model generating step includes generating at least one main element model according to the at least one main element data of each of the circuit segments and the at least one first parameter corresponding to the at least one main element data. The at least one main element model is corresponding to the at least one main element data of each of the circuit segments. The circuit segment model generating step includes generating a circuit segment model according to the at least one peripheral element data of each of the circuit segments and the at least one second parameter corresponding to the at least one peripheral element data. The circuit segment model is corresponding to each of the circuit segments. The model combining step includes combining the at least one main element model and the circuit segment model corresponding to each of the circuit segments to generate the simulation circuit.

According to further another aspect of the present disclosure, a computer readable recording medium stores a program for a processor capable of generating a simulation circuit automatically, to execute an automatically generating method for generating the simulation circuit. The automatically generating method for generating the simulation circuit includes performing a circuit dividing step, a circuit segmenting step, a main element model generating step, a circuit segment model generating step and a model combining step. The circuit dividing step includes configuring the processor to access a radio frequency circuit information from a memory unit, and divide the radio frequency circuit information into a plurality of circuit units. The circuit segmenting step includes configuring the processor to transform each of the circuit units into a plurality of circuit segments according to a circuit connecting relationship of each of the circuit units, and each of the circuit segments includes at least one main element data and at least one peripheral element data. The main element model generating step includes configuring the processor to generate at least one main element model according to the at least one main element data of each of the circuit segments and at least one first parameter corresponding to the at least one main element data. The at least one main element model is corresponding to the at least one main element data of each of the circuit segments. The circuit segment model generating step includes configuring the processor to generate a circuit segment model according to the at least one peripheral element data of each of the circuit segments and at least one second parameter corresponding to the at least one peripheral element data, and the circuit segment model is corresponding to each of the circuit segments. The model combining step includes configuring the processor to combine the at least one main element model and the circuit segment model corresponding to each of the circuit segments to generate the simulation circuit.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
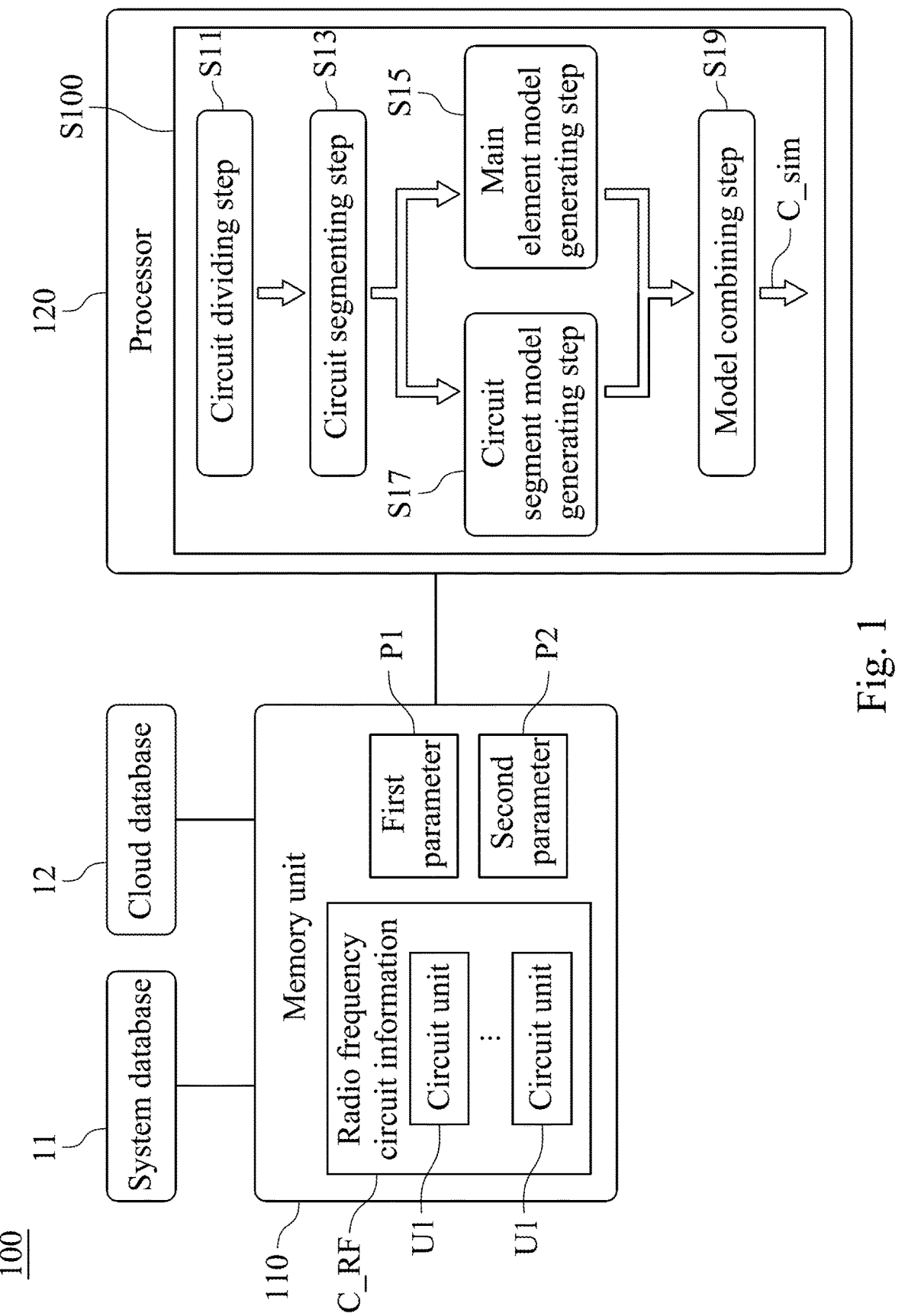
FIG. 1 shows a block diagram of an automatically generating system for generating a simulation circuit according to a first embodiment of the present disclosure.

Please refer to FIG. 1. FIG. 1 shows a block diagram of an automatically generating system 100 for generating a simulation circuit C_sim according to a first embodiment of the present disclosure. The automatically generating system 100 for generating the simulation circuit C_sim is configured to generate the simulation circuit C_sim automatically according to a radio frequency circuit information C_RF. The automatically generating system 100 for generating the simulation circuit C_sim includes a memory unit 110 and a processor 120. The memory unit 110 stores the radio frequency circuit information C_RF, a plurality of circuit units U1, a plurality of circuit segments F1, F2, F3 (shown in FIG. 3) corresponding to each of the circuit units U1, at least one first parameter P1 and at least one second parameter P2 corresponding to each of the circuit segments F1, F2, F3. Each of the circuit segments (e.g., the circuit segment F1) includes at least one main element data and at least one peripheral element data. The processor 120 is signally connected to the memory unit 110, and configured to perform an automatically generating method S100 for generating the simulation circuit C_sim. The automatically generating method S100 for generating the simulation circuit C_sim includes performing a circuit dividing step S11, a circuit segmenting step S13, a main element model generating step S15, a circuit segment model generating step S17 and a model combining step S19.

In detail, the memory unit 110 can be a memory or other data storing element, and the processor 120 can be a microprocessor, a Central Processing Unit (CPU) or other electronic processing unit, but the present disclosure is not limited thereto. In the first embodiment, the radio frequency circuit information C_RF is read from a circuit layout tool, the first parameter P1 is read from a data sheet of a cloud database 12, which is corresponding to the main element, and the second parameter P2 is read from a system database 11, which is built-in a simulation tool. The simulation tool can be Advanced Design System (ADS), but the present disclosure is not limited thereto. Thus, the automatically generating system 100 for generating the simulation circuit C_sim of the present disclosure can transform the radio frequency circuit information C_RF into the simulation circuit C_sim, which is applied to the simulation tool, automatically, thereby decreasing the transforming time.

Figure 2:
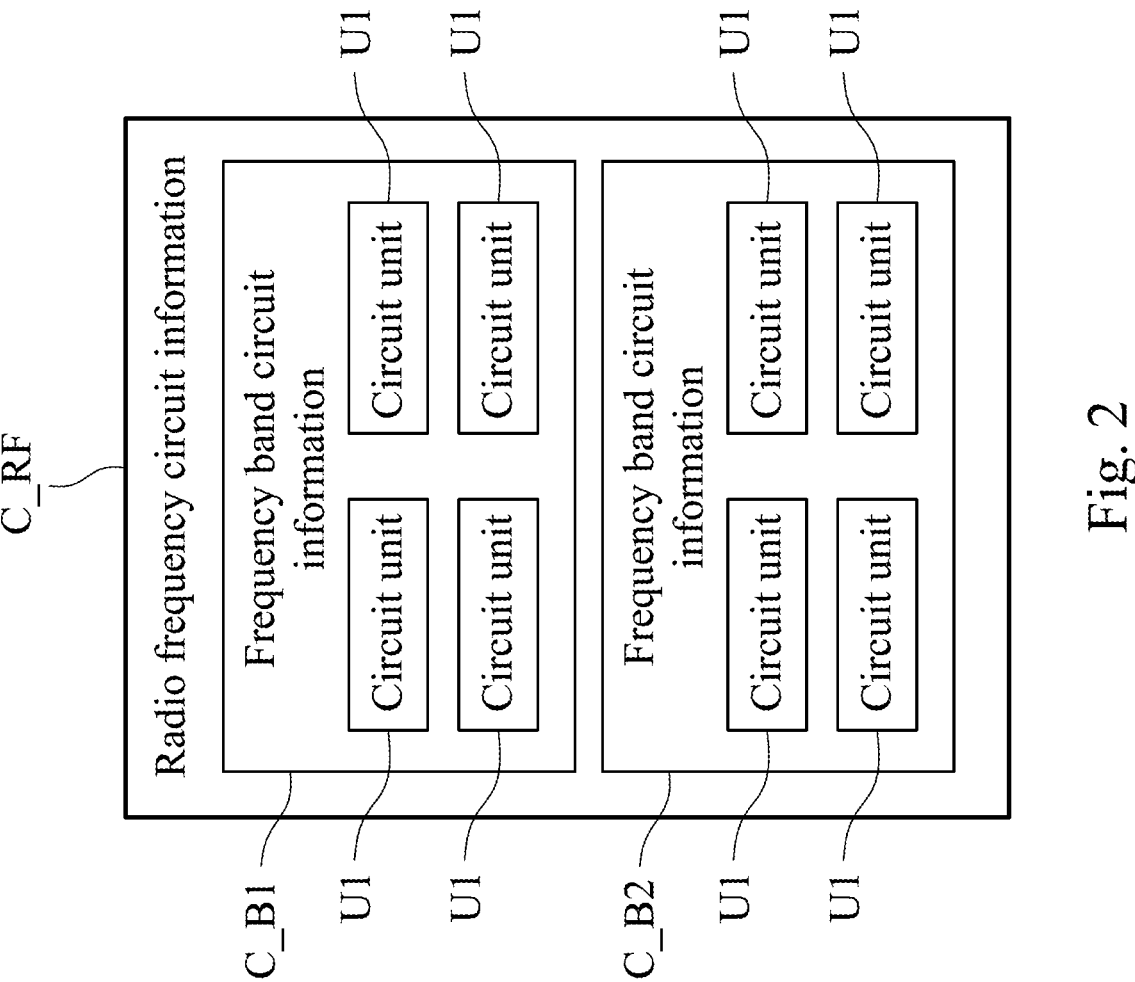
FIG. 2 shows a schematic view of a radio frequency circuit information of the automatically generating system for generating the simulation circuit of FIG. 1.

Please refer to FIG. 1 and FIG. 2. FIG. 2 shows a schematic view of the radio frequency circuit information C_RF of the automatically generating system 100 for generating the simulation circuit C_sim of FIG. 1. The circuit dividing step S11 includes configuring the processor 120 to access the radio frequency circuit information C_RF from the memory unit 110, and divide the radio frequency circuit information C_RF into the circuit units U1. In detail, the radio frequency circuit information C_RF can be a circuit diagram illustrated by a circuit layout tool. In the first embodiment, the circuit dividing step S11 divides the radio frequency circuit information C_RF into the circuit units U1 according to the different function in the radio frequency circuit, but the present disclosure is not limited thereto. The radio frequency circuit information C_RF includes a plurality of frequency band circuit information C_B1, C_B2, and each of the frequency band circuit information C_B1, C_B2 includes the circuit units U1.

Figure 3:
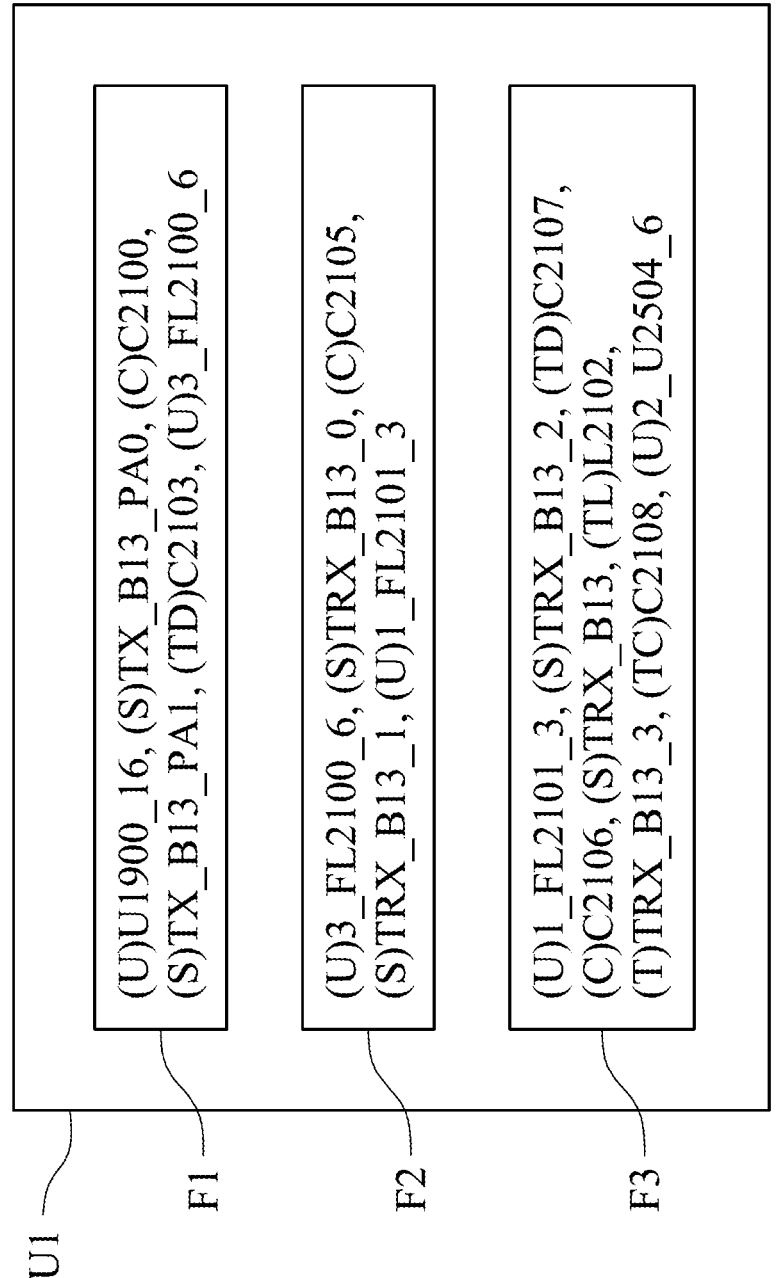
FIG. 3 shows a schematic view of one of the circuit units of the automatically generating system for generating the simulation circuit of FIG. 1.

Please refer to FIG. 1 to FIG. 3. FIG. 3 shows a schematic view of one of the circuit units U1 of the automatically generating system 100 for generating the simulation circuit C_sim of FIG. 1. The circuit segmenting step S13 includes configuring the processor 120 to transform each of the circuit units U1 into the circuit segments F1, F2, F3 according to a circuit connecting relationship of each of the circuit units U1. Moreover, in the circuit segmenting step S13, all the elements of each of the circuit units U1 are transformed into a string according to a connecting sequence, and the aforementioned string forms the one of the circuit segments F1, F2, F3 according to a main element. Each of the at least one main element data of each of the circuit segments F1, F2, F3 is corresponding to at least one main element of each of the circuit units U1, and the at least one peripheral element data is corresponding to at least one peripheral element of each of the circuit units U1. The at least one main element data can be one of a communication module and a radio frequency module, and the at least one peripheral element can be one of a resistor, a capacitor and an inductor. Furthermore, the peripheral element can be any of the electronic components except for the main element. One of the at least one main element data and the at least one peripheral element data can include at least one of an element type label, an element name label and a connection pin label. Each of the circuit segments F1, F2, F3 can further include a connecting wire data, and at least one of the circuit segments F1, F2, F3 can further include a continuing element data.

For example, the circuit unit U1 is transformed into the circuit segments F1, F2, F3, and the circuit segments F1, F2, F3 are listed in Table 1. The circuit segment F1 includes a main element data (U)3_FL2100_6, the peripheral element data (C)C2100, (TD)C2103, the connecting wire data (S)TX_B13_PA0, (S)TX_B13_PA1 and a continuing element data (U)U1900_16, which is connected with a previous circuit unit (not shown in figures). "(U)", "3", "FL2100" and "6" in the main element data (U)3_FL2100_6 represent an element type label, a connection pin label, an element name label and another connection pin label, respectively. The element type label represents the type of the circuit element, and is listed in Table 2. The element name label represents the model of the aforementioned main element, and (U) represents the elements except for the peripheral element and the connecting wire, such as a main element and a continuing element, which is connected with the previous circuit unit. (C), (TL), (TC) and (TD) represent the peripheral elements, and (S) and (T) represent the connecting wires. "C" and "C2100" of the peripheral element data (C)C2100 represent an element type label and an element name label, respectively. In other words, the main element data (U)3_FL2100_6 represents a main element FL2100, and the 3rd pin of the main element FL2100 is connected to the circuit segment F1, the 6th pin of the main element FL2100 is connected to the next circuit segment F2, and the peripheral element data (C)C2100 represents a capacitor which is named as C2100.

TABLE 1

| F1 | (U)U1900_16, (S)TX_B13_PA0, (C)C2100, (S)TX_B13_PA1, (TD)C2103, (U)3_FL2100_6 |
|---|---|

TABLE 1-continued

| F2 | (U)3_FL2100_6, (S)TRX_B13_0, (C)C2105, (S)TRX_B13_1, (U)1_FL2101_3 |
|---|---|
| F3 | (U)1_FL2101_3, (S)TRX_B13_2, (TD)C2107, (C)C2106, (S)TRX_B13, (TL)L2102, (T)TRX_B13_3, (TC)C2108, (U)2_U2504_6 |

TABLE 2

| (C) | capacitor | | (TD) | shunted to grounded element |
|---|---|---|---|---|
| (TL) | shunted to grounded inductor | (S) | series wire | |
| (TC) | shunted to grounded capacitor | (T) | shunted to grounded wire | |
| (U) | elements except for the peripheral element and connecting wire | | | |

Moreover, each of the circuit segments F1, F2, F3 includes at least one main element data and at least one peripheral element data. The at least one main element data is corresponding to at least one main element, and the at least one peripheral element data is corresponding to a peripheral element, which is connected to the at least one main element. Therefore, each of the circuit segments F1, F2, F3 is configured to represent the peripheral element and connecting wire, which are connected to the main element data. FIG. 3 shows the circuit segments F1, F2, F3 corresponding to one of the circuit units U1, and a number of the circuit segments (not shown in figures) corresponding to other circuit units U1 depends on the circuit complexity and a number of the main element of the circuit.

Figure 4:
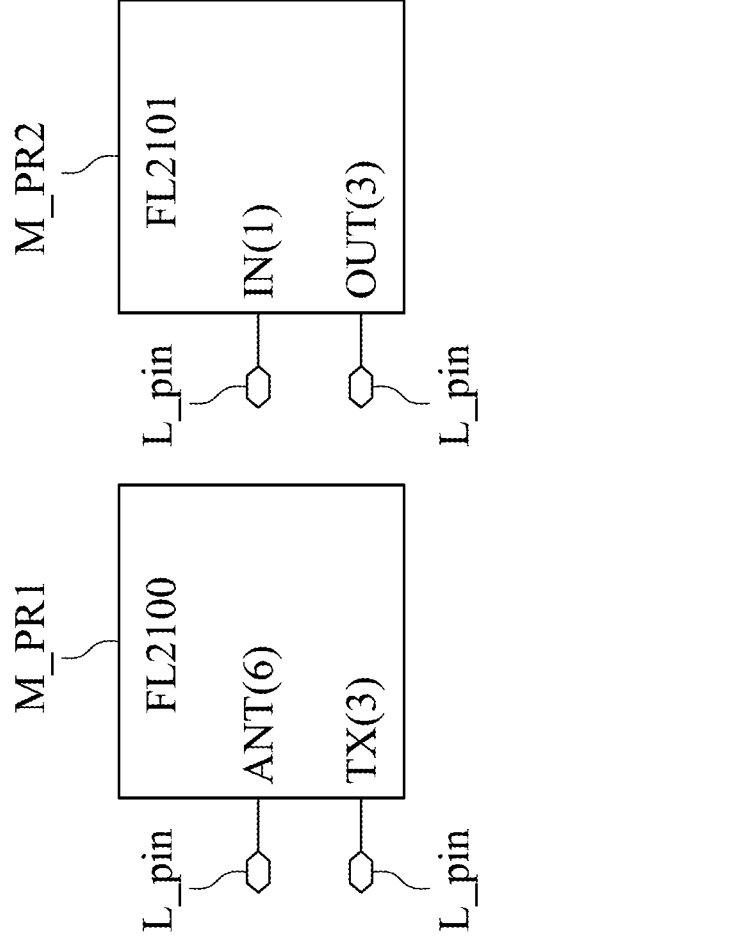
FIG. 4 shows a schematic view of main element models of the automatically generating system for generating the simulation circuit of FIG. 1.

Please refer to FIG. 1 to FIG. 4. FIG. 4 shows a schematic view of main element models M_PR1, M_PR2 of the automatically generating system 100 for generating the simulation circuit C_sim of FIG. 1. The main element model generating step S15 includes configuring the processor 120 to generate the main element models M_PR1, M_PR2 according to the main element data of each of the circuit segments F1, F2, F3 and at least one first parameter P1 corresponding to the main element data. The main element models M_PR1, M_PR2 are corresponding to the main element data of each of the circuit segments F1, F2, F3. For instance, the main element model generating step S15 is performed to find out all the main elements (i.e., elements FL2100, FL2101) from circuit segments F1, F2, F3 of the aforementioned circuit unit U1, and list the main element models M_PR1, M_PR2, correspondingly. Meanwhile, the pins of the main elements are listed according to the connection pin label. According to the main element data (U)3_FL2100_6 of the circuit segment F1 in Table 1, the 3rd pin of the element FL2100 is connected to the circuit segment F1, and the 6th pin of the element FL2100 is connected to the circuit segment F2. Moreover, the main element model generating step S15 further reads the first parameters P1 and the pin configuration of the main elements (i.e., elements FL2100, FL2101) from the memory unit 110 to generate the main element models M_PR1, M_PR2. The first parameters P1 can be S-parameter of the main elements, but the present disclosure is not limited thereto. Furthermore, the main element models M_PR1, M_PR2 include the labels L_pin corresponding to the pins.

The main element models M_PR1, M_PR2 are corresponding to the elements FL2100, FL2101, respectively. ANT(6), TX(3), IN(1), OUT(3) of the main element models M_PR1, M_PR2 represent the configuration and relative pins in each of the elements. For example, TX(3) represents that the 3rd pin of element FL2100 is a transmitting terminal (TX), and so on.

Figure 5:
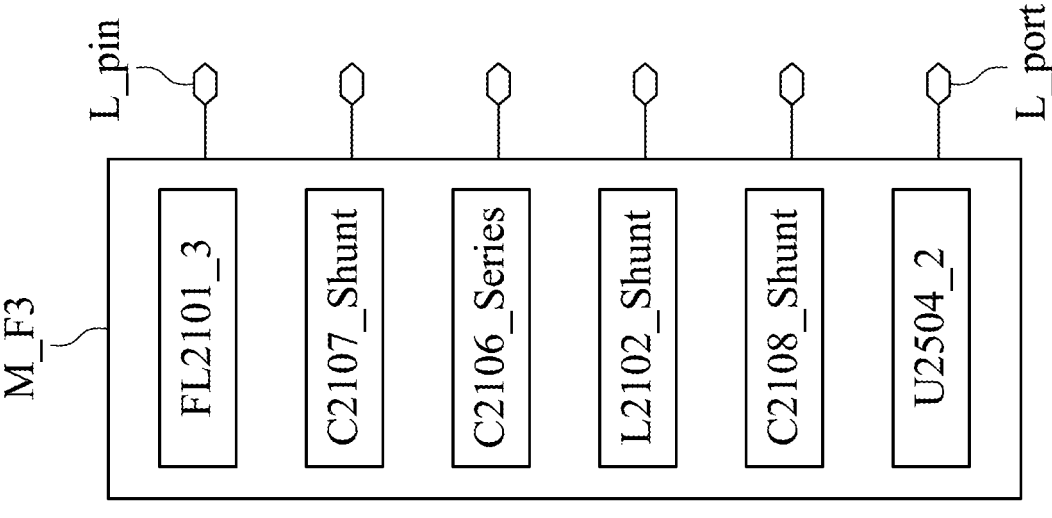
FIG. 5 shows a schematic view of circuit segment models of the automatically generating system for generating the simulation circuit of FIG. 1.
Figure 5:
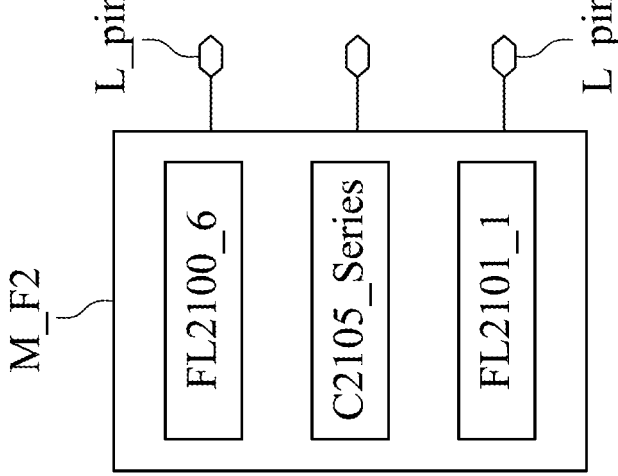
Figure 5:

Please refer to FIG. 1 to FIG. 5. FIG. 5 shows a schematic view of circuit segment models M_F1, M_F2, M_F3 of the automatically generating system 100 for generating the simulation circuit C_sim of FIG. 1. The circuit segment model generating step S17 includes configuring the processor 120 to generate one of the circuit segment models M_F1, M_F2, M_F3 according to the at least one peripheral element data of each of the circuit segments F1, F2, F3 and at least one second parameter P2 corresponding to the at least one peripheral element data. The circuit segment models M_F1, M_F2, M_F3 are corresponding to the circuit segments F1, F2, F3, respectively. A number of a plurality of ports of one of the circuit segment models M_F1, M_F2, M_F3 is a sum of a number of the main element data, a number of the peripheral element data and a number of the continuing element data. For example, the circuit segment model generating step S17 is performed to list the continuing element data, the main element data and the peripheral element data of the circuit segment F1 into the circuit segment model M_F1, and calculate the sum of the number of the continuing element data, the main element data and the peripheral element data to establish the labels L_pin, L_port of the ports. Furthermore, the continuing element data in the circuit segment F1 is (U)U1900_16, the number of the continuing element data is 1, the main element data is (U)3_FL2100_6, the number of the main element data is 1, the peripheral element data are (C)C2100 and (TD)C2103, the number of the peripheral element data is 2, and the aforementioned sum of the number is 4. Therefore, the number of the ports in the circuit segment model M_F1 is 4. Moreover, the second parameter P2 can be S-parameter of the peripheral element, but the present disclosure is not limited thereto.

FL2100_3, FL2100_6, FL2101_1, FL2101_3 of the circuit segment models M_F1, M_F2, M_F3 represent the connecting pins corresponding to the main elements. For instance, FL2100_3 represents that the circuit segment F1 is connected to a 3rd pin of the element FL2100, and so on. CL2100_Series, C2103_Shunt, C2105_Seires, C2107_Shunt, C2106_Series, L2102_Shunt, C2108_Shunt of the circuit segment models M_F1, M_F2, M_F3 represent the connection way of the peripheral elements. U1900_16, U2504_2 of the circuit segment models M_F1, M_F3 are connected to the label L_port. For example, C2103_Shunt represents a capacitor, which is named C2101, is shunted, and so on.

Figure 6:
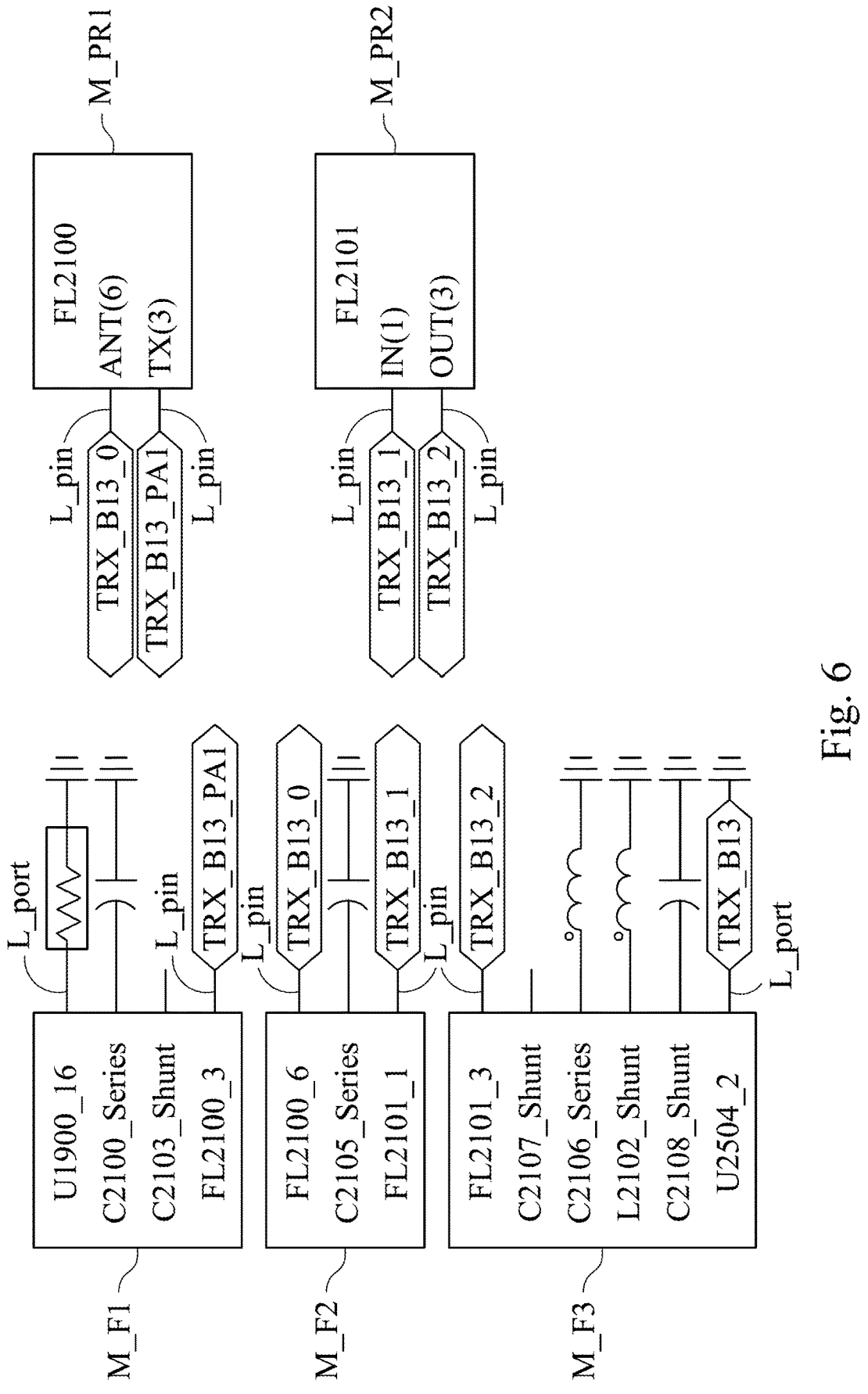
FIG. 6 shows a schematic view of the simulation circuit of the automatically generating system for generating the simulation circuit of FIG. 1.

Please refer to FIG. 1 to FIG. 6. FIG. 6 shows a schematic view of the simulation circuit C_sim of the automatically generating system 100 for generating the simulation circuit C_sim of FIG. 1. The model combining step S19 includes configuring the processor 120 to combine the main element models M_PR1, M_PR2 and the circuit segment models M_F1, M_F2, M_F3 corresponding to each of the circuit segments F1, F2, F3 to generate the simulation circuit C_sim. In detail, the model combining step S19 is performed to fill the connection pin data of the circuit segments F1, F2, F3 into the label L_pin of the pin of the main element models M_PR1, M_PR2, and fill the connection pin data of the peripheral element data corresponding to the peripheral elements into the labels L_pin of the ports of the circuit segment models M_F1, M_F2, M_F3.

The automatically generating method S100 for generating the simulation circuit C_sim of the present disclosure generates the simulation circuit C_sim automatically by transforming the radio frequency circuit information C_RF into the circuit segments F1, F2, F3 represented in characters according to the characteristic of all the elements in the radio frequency circuit information C_RF and the connecting relationship between all the elements, and generating the main element models M_PR1, M_PR2 and the circuit segment models M_F1, M_F2, M_F3. Thus, the automatically generating method S100 for generating the simulation circuit C_sim of the present disclosure can shorten the time of transforming the radio frequency circuit information C_RF into the simulation circuit C_sim, and avoid the input error during the manual transforming process.

Figure 7:
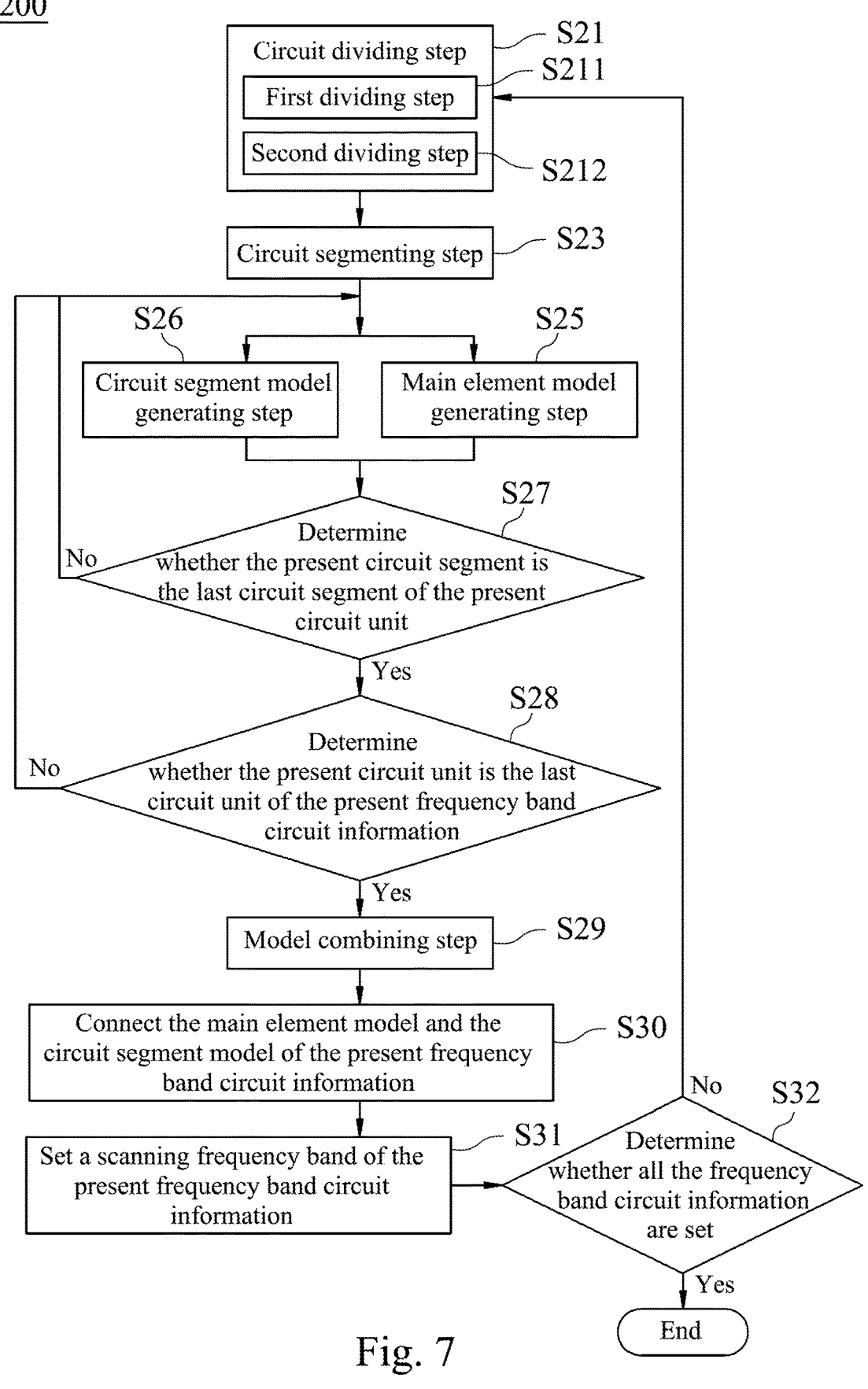
FIG. 7 shows a flow chart of an automatically generating method for generating a simulation circuit according to a second embodiment of the present disclosure.

Please refer to FIG. 1 to FIG. 7. FIG. 7 shows a flow chart of an automatically generating method S200 for generating a simulation circuit C_sim according to a second embodiment of the present disclosure. The automatically generating method S200 for generating the simulation circuit C_sim includes performing a circuit dividing step S21, a circuit segmenting step S23, a main element model generating step S25, a circuit segment model generating step S26 and a model combining step S29. In the second embodiment, the circuit segmenting step S23, the main element model generating step S25, the circuit segment model generating step S26 and the model combining step S29 of the automatically generating method S200 for generating the simulation circuit C_sim are the same as the circuit segmenting step S13, the main element model generating step S15, the circuit segment model generating step S17 and the model combining step S19 of the automatically generating method S100 for generating the simulation circuit C_sim, and will not described again. Further, the automatically generating method S200 for generating the simulation circuit C_sim can further include steps S27, S28, S30, S31, S32, and the circuit dividing step S21 can include a first dividing step S211 and a second dividing step S212.

The first dividing step S211 includes configuring the processor 120 to divide the radio frequency circuit information C_RF into a plurality of frequency band circuit information C_B1, C_B2. The second dividing step S212 includes configuring the processor 120 to divide each of the frequency band circuit information C_B1, C_B2 into a plurality of circuit units U1. In other words, the first dividing step S211 can divide the radio frequency circuit information C_RF into the frequency band circuit information C_B1, C_B2 according to the frequency bands of the different wireless channels in the radio frequency circuit information C_RF. The second dividing step S212 can divide each of the frequency band circuit information C_B1, C_B2 into the circuit units U1.

The step S27 is performed to determine whether the present circuit segment (i.e., one of the circuit segments F1, F2, F3) is the last circuit segment F3 of the present circuit unit U1. In response to determining that the present circuit segment is the last circuit segment F3 of the present circuit unit U1, the processor 120 is configured to perform the step S28. In response to determining that the present circuit segment is not the last circuit segment F3 of the present circuit unit U1, the processor 120 is configured to perform the main element model generating step S25 and the circuit segment model generating step S26. In other words, the step S27 determines whether the main element models M_PR1, M_PR2 and the circuit segment models M_F1, M_F2, M_F3 of all the circuit segments F1, F2, F3 of the present circuit unit U1 are established completely.

The step S28 is performed to determine whether the present circuit unit U1 is the last circuit unit U1 of the present frequency band circuit information C_B1. In response to determining that the present circuit unit U1 is the last circuit unit U1 of the present frequency band circuit information C_B1, the processor 120 is configured to perform the step S29. In response to determining that the present circuit unit U1 is not the last circuit unit U1 of the present frequency band circuit information C_B1, the processor 120 is configured to perform the main element model generating step S25 and the circuit segment model generating step S26. In other words, the step S28 determines whether the main element models M_PR1, M_PR2 and the circuit segment models M_F1, M_F2, M_F3 of all the circuit segments F1, F2, F3 of the present frequency band circuit information C_B1 are established completely.

The step S30 is performed to connect the main element models M_PR1, M_PR2 and the circuit segment models M_F1, M_F2, M_F3 of the present frequency band circuit information C_B1.

The step S31 is performed to set a scanning frequency band of the present frequency band circuit information C_B1.

The step S32 is performed to determine whether all the frequency band circuit information C_B1, C_B2 are set completely. In response to determining that all the frequency band circuit information C_B1, C_B2 are set, the processor 120 is configured to end the S200. In response to determining that all the frequency band circuit information C_B1, C_B2 are not completely set, the processor 120 is configured to perform the circuit dividing step S21. In other words, the step S32 determines whether the main element models M_PR1, M_PR2 and the circuit segment models M_F1, M_F2, M_F3 of all the frequency band circuit information C_B1 of the radio frequency circuit information C_RF are established completely.

In other embodiment, the main element model generating step can be performed before the circuit segment model generating step or can be performed after the circuit segment model generating step, but the present disclosure is not limited thereto.

A computer readable recording medium stores a program for the processor 120 capable of generating a simulation circuit C_sim automatically, to execute the automatically generating methods S100, S200 for generating the simulation circuit. The computer readable recording medium can be a CR-ROM, a flexible disk (FD), a CD-R, a digital versatile disk (DVD), a USB medium and a flash memory, but the present disclosure is not limited thereto.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An automatically generating method for generating a simulation circuit, which is configured to generate the simulation circuit automatically according to a radio frequency circuit information, and the automatically generating method for generating the simulation circuit comprising:

performing a circuit dividing step, wherein the circuit dividing step comprises configuring a processor to access the radio frequency circuit information from a memory unit, and divide the radio frequency circuit information into a plurality of circuit units;

performing a circuit segmenting step, wherein the circuit segmenting step comprises configuring the processor to transform each of the circuit units into a plurality of circuit segments according to a circuit connecting relationship of each of the circuit units, and each of the circuit segments comprises at least one main element data and at least one peripheral element data;

performing a main element model generating step, wherein the main element model generating step comprises configuring the processor to generate at least one main element model according to the at least one main element data of each of the circuit segments and at least one first parameter corresponding to the at least one main element data, and the at least one main element model is corresponding to the at least one main element data of each of the circuit segments;

performing a circuit segment model generating step, wherein the circuit segment model generating step comprises configuring the processor to generate a circuit segment model according to the at least one peripheral element data of each of the circuit segments and at least one second parameter corresponding to the at least one peripheral element data, and the circuit segment model is corresponding to each of the circuit segments; and performing a model combining step, wherein the model combining step comprises configuring the processor to combine the at least one main element model and the circuit segment model corresponding to each of the circuit segments to generate the simulation circuit.

2. The automatically generating method for generating the simulation circuit of claim 1, wherein the circuit dividing step further comprises:

performing a first dividing step, wherein the first dividing step comprises configuring the processor to divide the radio frequency circuit information into a plurality of frequency band circuit information; and performing a second dividing step, wherein the second dividing step comprises configuring the processor to divide each of the frequency band circuit information into the circuit units.

3. The automatically generating method for generating the simulation circuit of claim 1, wherein one of the at least one main element data and the at least one peripheral element data of each of the circuit segments comprises at least one of an element type label, an element name label and a connection pin label.

4. The automatically generating method for generating the simulation circuit of claim 3, wherein at least one of the circuit segments further comprises a continuing element data, and a number of a plurality of ports of the circuit segment model is a sum of a number of the at least one main element data, a number of the at least one peripheral element data and a number of the continuing element data.

5. The automatically generating method for generating the simulation circuit of claim 1, wherein, each of the at least one main element data of each of the circuit segments is corresponding to at least one main element of each of the circuit units, and the at least one main element is one of a communication module and a radio frequency module; and the at least one peripheral element data is corresponding to at least one peripheral element of each of the circuit units, and the at least one peripheral element is one of a resistor, a capacitor and an inductor.

6. An automatically generating system for generating a simulation circuit, which is configured to generate the simulation circuit automatically according to a radio frequency circuit information, and the automatically generating system for generating the simulation circuit comprising:

a memory unit storing the radio frequency circuit information, a plurality of circuit units, a plurality of circuit segments corresponding to each of the circuit units, at least one first parameter and at least one second parameter corresponding to each of the circuit segments, wherein each of the circuit segments comprises at least one main element data and at least one peripheral element data; and a processor signally connected to the memory unit, and configured to perform an automatically generating method for generating the simulation circuit comprising:

performing a circuit dividing step, wherein the circuit dividing step comprises accessing the radio frequency circuit information from the memory unit, and dividing the radio frequency circuit information into the circuit units;

performing a circuit segmenting step, wherein the circuit segmenting step comprises transforming each of the circuit units into the circuit segments according to a circuit connecting relationship of each of the circuit units;

performing a main element model generating step, wherein the main element model generating step comprises generating at least one main element model according to the at least one main element data of each of the circuit segments and the at least one first parameter corresponding to the at least one main element data, and the at least one main element model is corresponding to the at least one main element data of each of the circuit segments;

performing a circuit segment model generating step, wherein the circuit segment model generating step comprises generating a circuit segment model according to the at least one peripheral element data of each of the circuit segments and the at least one second parameter corresponding to the at least one peripheral element data, and the circuit segment model is corresponding to each of the circuit segments; and performing a model combining step, wherein the model combining step comprises combining the at least one main element model and the circuit segment model corresponding to each of the circuit segments to generate the simulation circuit.

7. The automatically generating system for generating the simulation circuit of claim 6, wherein the circuit dividing step further comprises:

performing a first dividing step, wherein the first dividing step comprises dividing the radio frequency circuit information into a plurality of frequency band circuit information; and performing a second dividing step, wherein the second dividing step comprises dividing each of the frequency band circuit information into the circuit units.

8. The automatically generating system for generating the simulation circuit of claim 6, wherein one of the at least one main element data and the at least one peripheral element data of each of the circuit segments comprises at least one of an element type label, an element name label and a connection pin label.

9. The automatically generating system for generating the simulation circuit of claim 8, wherein at least one of the circuit segments further comprises a continuing element data, and a number of a plurality of ports of the circuit segment model is a sum of a number of the at least one main element data, a number of the at least one peripheral element data and a number of the continuing element data.

10. The automatically generating system for generating the simulation circuit of claim 6, wherein, each of the at least one main element data of each of the circuit segments is corresponding to at least one main element of each of the circuit units, and the at least one main element is one of a communication module and a radio frequency module; and the at least one peripheral element data is corresponding to at least one peripheral element of each of the circuit units, and the at least one peripheral element is one of a resistor, a capacitor and an inductor.

11. A computer readable recording medium storing a program for a processor capable of generating a simulation circuit automatically, to execute an automatically generating method for generating the simulation circuit comprising:

performing a circuit dividing step, wherein the circuit dividing step comprises configuring the processor to access a radio frequency circuit information from a memory unit, and divide the radio frequency circuit information into a plurality of circuit units;

performing a circuit segmenting step, wherein the circuit segmenting step comprises configuring the processor to transform each of the circuit units into a plurality of circuit segments according to a circuit connecting relationship of each of the circuit units, and each of the circuit segments comprises at least one main element data and at least one peripheral element data;

performing a main element model generating step, wherein the main element model generating step comprises configuring the processor to generate at least one main element model according to the at least one main element data of each of the circuit segments and at least one first parameter corresponding to the at least one main element data, and the at least one main element model is corresponding to the at least one main element data of each of the circuit segments;

performing a circuit segment model generating step, wherein the circuit segment model generating step comprises configuring the processor to generate a circuit segment model according to the at least one peripheral element data of each of the circuit segments and at least one second parameter corresponding to the at least one peripheral element data, and the circuit segment model is corresponding to each of the circuit segments; and performing a model combining step, wherein the model combining step comprises configuring the processor to combine the at least one main element model and the circuit segment model corresponding to each of the circuit segments to generate the simulation circuit.

* * * * *